United States Patent
Ludicky

(10) Patent No.: US 9,455,642 B2
(45) Date of Patent: Sep. 27, 2016

(54) DIGITAL FREQUENCY SELECTIVE TRANSFORMER-RECTIFIER UNIT RIPPLE FAULT DETECTION

(71) Applicant: Hamilton Sundstrand Corporation, Charlotte, NC (US)

(72) Inventor: Frank J. Ludicky, Machesney Park, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/584,059

(22) Filed: Dec. 29, 2014

(65) Prior Publication Data

US 2016/0190951 A1 Jun. 30, 2016

(51) Int. Cl.
*H02M 7/04* (2006.01)
*H02M 7/217* (2006.01)
*H02M 1/42* (2007.01)

(52) U.S. Cl.
CPC ............... *H02M 7/04* (2013.01); *H02M 1/42* (2013.01); *H02M 7/217* (2013.01)

(58) Field of Classification Search
CPC ...................................... H02M 7/04
USPC ................................................ 363/84
See application file for complete search history.

(56) References Cited

U.S. PATENT DOCUMENTS

| | | | |
|---|---|---|---|
| 4,644,248 A | 2/1987 | Brennen et al. | |
| 5,053,722 A | 10/1991 | Kuo et al. | |
| 7,514,907 B2 | 4/2009 | Rajda et al. | |
| 8,570,003 B2 | 10/2013 | Lu et al. | |
| 8,676,386 B2 | 3/2014 | Klodowski et al. | |
| 2005/0084115 A1* | 4/2005 | Enamito | G10K 11/1782 381/71.7 |
| 2008/0100135 A1* | 5/2008 | Lazarovich | H02J 5/00 307/9.1 |
| 2011/0069794 A1* | 3/2011 | Tavassoli Kilani | H04L 25/0274 375/346 |
| 2011/0095602 A1* | 4/2011 | Matsumoto | B60L 9/08 307/9.1 |

* cited by examiner

*Primary Examiner* — Matthew Nguyen
*Assistant Examiner* — Trinh Dang
(74) *Attorney, Agent, or Firm* — Carlson, Gaskey & Olds, PC

(57) ABSTRACT

A circuit for converting variable frequency generated AC electric power to DC electric power for use on loads comprises a transformer-rectifier unit to convert a generated AC electric power to DC electric power. A tap senses the converted DC power downstream of the transformer-rectifier unit with a filter, which passes a filtered signal to a control for detecting a fault on the transformer-rectifier unit by passing a higher-order harmonic of the generated AC power as the filtered signal. A tap senses an AC frequency of the generated AC power reaching the transformer-rectifier unit. The sensed AC frequency is utilized to tune the filter, such that the filter will pass the higher order harmonic, as the higher order harmonic varies with variation in the AC frequency. A power system is also disclosed.

19 Claims, 2 Drawing Sheets

DIGITAL FREQUENCY SELECTIVE TRANSFORMER-RECTIFIER UNIT RIPPLE FAULT DETECTION

BACKGROUND OF THE INVENTION

This application relates to a circuit and method of detecting a fault on a transformer-rectifier unit.

Modern electrical systems are becoming more and more complex. One system involves a variable frequency generator that supplies a variable AC current to a bus. The AC current may pass through a transformer-rectifier unit to convert the AC electric power to DC electric power.

The transformer-rectifier unit DC output may typically have voltage ripples that contain higher harmonics of the AC electric power frequency, along with noise induced by loads on the DC bus.

Harmonics are voltages or currents that operate at a frequency that is an integer of a fundamental frequency. Thus, if the frequency of the power signal is X, then the second harmonic frequency would be 2X.

At times, a transformer-rectifier unit may have a fault. In such cases, a voltage ripple that is the second harmonic of the frequency of the AC bus supplied to the transformer-rectifier unit will be present.

Thus, for fault detection, it is known to look for the presence of a second harmonic of the AC frequency. However, this second harmonic must be detected in the presence of other frequencies to reliably indicate a fault on the transformer-rectifier unit. Detection of a given harmonic is complicated because the generator AC power is not constant frequency, but may vary over a two to three times range.

Such systems are often utilized on aircraft applications.

SUMMARY OF THE INVENTION

A circuit for converting variable frequency generated AC electric power to DC electric power for use on loads comprises a transformer-rectifier unit to convert a generated AC electric power to DC electric power. A tap senses the converted DC power downstream of the transformer-rectifier unit with a filter, which passes a filtered signal to a control for detecting a fault on the transformer-rectifier unit by passing a higher-order harmonic of the generated AC power as the filtered signal. A tap senses an AC frequency of the generated AC power reaching the transformer-rectifier unit. The sensed AC frequency is utilized to tune the filter, such that the filter will pass the higher order harmonic, as the higher order harmonic varies with variation in the AC frequency. A power system is also disclosed.

These and other features may be best understood from the following drawings and specification.

DETAILED DESCRIPTION

Figure 1:
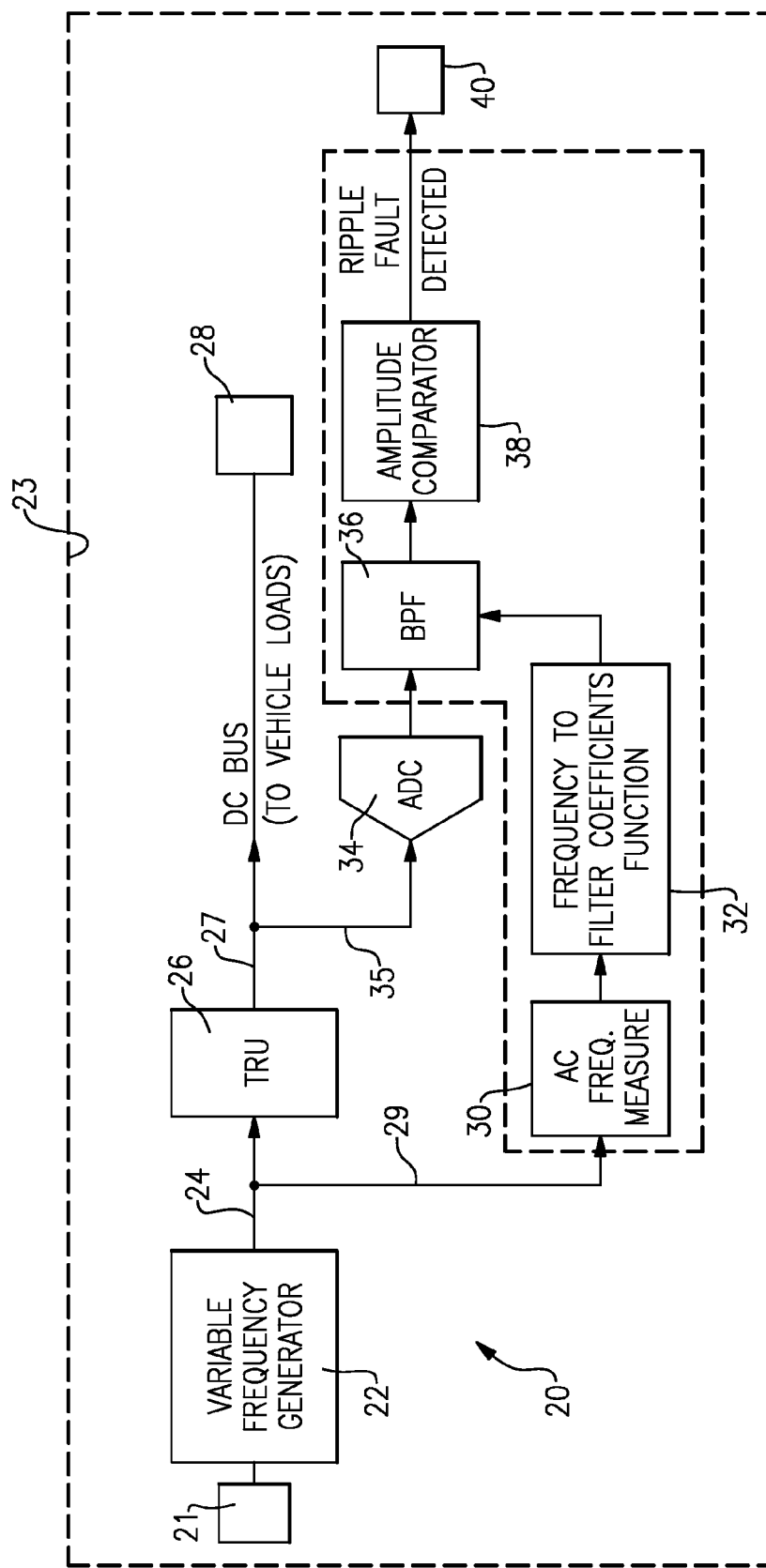
FIG. 1 is a schematic view of a system.

FIG. 1 shows a system 20 incorporating a variable AC generator 22. Generator 22 may be associated with an aircraft shown in phantom at 23 and may be driven by a gas turbine engine 21 also shown schematically.

As is known, as the speed of the engine 21 changes the frequency of the AC current generated by generator 22 also varies. The variation can be over three hundred percent.

A variable AC current is supplied to a bus at 24 and passes to a transformer-rectifier unit (TRU) 26. The TRU 26 converts AC electric power to DC electric power and is a known component. The converted DC power passes downstream to a DC bus 27 and is utilized to power vehicle loads such as shown schematically at 28.

A sample 29 of the AC frequency passes to an AC frequency measure block 30 and a frequency to filter coefficient function 32. Block 30 can be typically be implemented as a digital counter that measures the period of an AC cycle on sample 29. The filter coefficient function 32 synthesizes the digital filter coefficients either by using mathematical functions or table lookup based on the period of the AC cycle.

The output of the frequency to filter coefficient function 32 passes to a variable discrete time band pass filter 36.

The frequency to filter coefficient function output will tune the pass band range for the band pass filter 36 to the second harmonic of the measured AC frequency. More generally, other higher order harmonics may be passed or rejected along with varying the filter bandwidth (Q) with AC frequency.

Another tap 35 from the DC bus 27 passes through an analog to digital converter 34 and also to the band pass filter 36. The band pass filter 36 will be tuned by the output of the frequency to filter coefficient function 32 such that its pass band is the second harmonic of the AC frequency, which passes to an amplitude comparator block 38.

If a ripple fault is detected, such as when the second harmonic of the AC frequency is present, a signal is sent to a controller 40 which can identify a fault on the transformer-rectifier unit 26. The system that controls electric power generation (which may be controller 40, or any controller such as associated with aircraft flight or electric power control) may use this fault information to determine if the transformer rectifier unit should be disconnected from the DC bus 27 to which it is supplying power. The specifics of this determination may be as known.

Figure 2:
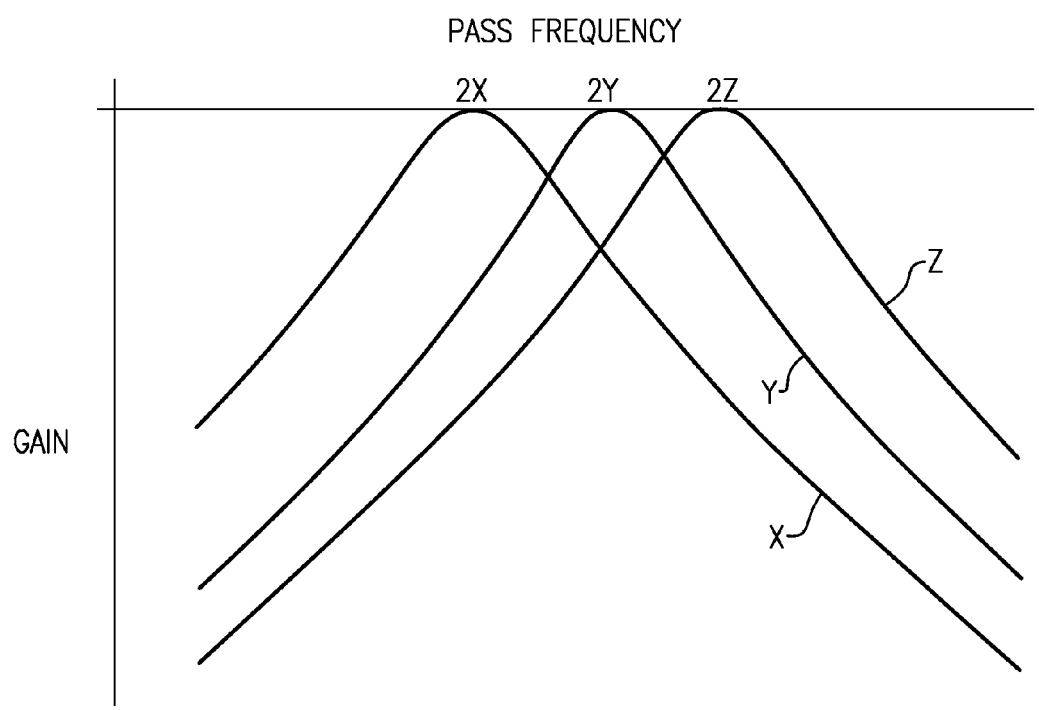
FIG. 2 is a graph of a band pass filter pass band.

FIG. 2 shows three example AC signals at frequencies X, Y and Z. As shown, the peak gain for each occurs at pass frequencies of 2X, 2Y, and 2Z, respectively. The disclosed system thus provides accurate fault sensing even as the AC frequency varies.

Of course, any number of other ways of tuning a pass band from a filter based upon a measured AC frequency of the AC frequency supplied would come within the scope of this disclosure.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A circuit for converting variable frequency generated AC electric power to DC electric power for use on loads comprising:
   a transformer-rectifier unit to convert a generated AC electric power to DC electric power;
   a tap for sensing the converted DC electric power downstream of said transformer-rectifier unit with a filter, and said filter passing a filtered signal to a control for detecting a fault on said transformer-rectifier unit by passing a higher-order harmonic of the generated AC electric power as the filtered signal; and
   a tap for sensing an AC frequency of the generated electric AC power reaching said transformer-rectifier unit, and said sensed AC frequency being utilized to tune said filter, such that said filter will pass said higher order harmonic, as said higher order harmonic varies with variation in said AC frequency.

2. The circuit as set forth in claim 1, wherein said filter is a variable band pass filter.

3. The circuit as set forth in claim 1, wherein said higher order harmonic is a second order harmonic.

4. The circuit as set forth in claim 1, wherein said sensed AC frequency passes through an AC frequency measurement block and then a block which translates said measured frequency to a filter coefficients for said filter.

5. The circuit as set forth in claim 1, wherein a variable frequency AC generator provides the generated AC electric power to said transformer-rectifier unit.

6. The circuit as set forth in claim 1, wherein said circuit is associated with an aircraft.

7. The circuit as set forth in claim 1, wherein said higher order harmonic is a second order harmonic, said sensed AC frequency passes through an AC frequency measurement block and then a block which translates said measured frequency to a filter coefficients for said filter, a variable frequency AC generator provides the generated AC electric power to said transformer-rectifier unit, a gas turbine engine drives said variable frequency generator, said circuit is associated with an aircraft, and said DC electric power is on a DC bus to power loads associated with said aircraft.

8. The circuit as set forth in claim 2, wherein said sensed DC power passes through an analog to digital converter before being directed to said band pass filter.

9. The circuit as set forth in claim 5, wherein a gas turbine engine drives said variable frequency generator.

10. The circuit as set forth in claim 6, wherein said DC electric power is on a DC bus to power loads associated with said aircraft.

11. The circuit as set forth in claim 8, wherein said band pass filter passes said filtered signal to a control to identify a fault on said transformer-rectifier unit.

12. The circuit as set forth in claim 11, wherein said higher order harmonic is a second order harmonic, said sensed AC frequency passes through an AC frequency measurement block and then a block which translates said measured frequency to a filter coefficients for said filter, a variable frequency AC generator provides the generated AC electric power to said transformer-rectifier unit, a gas turbine engine drives said variable frequency generator, said circuit is associated with an aircraft, and said DC electric power is on a DC bus to power loads associated with said aircraft.

13. A power system comprising:
an AC variable frequency generator;
a transformer-rectifier unit to convert a generated AC electric power to DC electric power;
a DC bus powering loads;
a tap for sensing the converted DC electric power on said DC bus downstream of said transformer-rectifier unit with a filter, and said filter passing a filtered signal to a control for detecting a fault on said transformer-rectifier unit by passing a higher-order harmonic of AC electric power reaching said transformer-rectifier unit as the filtered signal;
a tap for sensing an AC frequency of the generated AC electric power reaching said transformer-rectifier unit, and said sensed AC frequency being utilized to tune said filter, such that said filter will pass said higher order harmonic, as said higher order harmonic varies with variation in said AC frequency; and
said filter passes said filtered signal to a control to identify a fault on said transformer-rectifier unit.

14. The power system as set forth in claim 13, wherein said filter is a variable band pass filter.

15. The power system as set forth in claim 13, wherein said higher order harmonic is a second order harmonic.

16. The power system as set forth in claim 13, wherein said sensed AC frequency passes through an AC frequency measurement block and then a block which translates said measured frequency to a filter coefficient for said filter.

17. The power system as set forth in claim 13, wherein said power system is associated with an aircraft, and said loads are associated with said aircraft.

18. The power system as set forth in claim 13, wherein said higher order harmonic is a second order harmonic, said sensed AC frequency passes through an AC frequency measurement block and then a block which translates said measured frequency to a filter coefficient for said filter, and said power system is associated with an aircraft, and said loads are associated with said aircraft.

19. The power system as set forth in claim 14, wherein said higher order harmonic is a second order harmonic, said sensed AC frequency passes through an AC frequency measurement block and then a block which translates said measured frequency to a filter coefficient for said filter, and said power system is associated with an aircraft, and said loads are associated with said aircraft.

* * * * *